US009142483B2

(12) United States Patent
Sunaga et al.

(10) Patent No.: US 9,142,483 B2
(45) Date of Patent: Sep. 22, 2015

(54) MOUNTING STRUCTURE OF TRANSMISSION MODULE

(71) Applicant: Hitachi Metals, Ltd., Minato-ku, Tokyo (JP)

(72) Inventors: Yoshinori Sunaga, Hitachinaka (JP); Yoshiaki Ishigami, Hitachi (JP); Kinya Yamazaki, Hitachi (JP); Akihiro Hiruta, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/505,049

(22) Filed: Oct. 2, 2014

(65) Prior Publication Data
US 2015/0123260 A1 May 7, 2015

(30) Foreign Application Priority Data

Nov. 5, 2013 (JP) ................................ 2013-229133

(51) Int. Cl.
*H01L 23/34* (2006.01)
*H05K 7/20* (2006.01)
*H01L 23/473* (2006.01)
*H01L 23/467* (2006.01)
*H01L 23/36* (2006.01)
*H01L 23/367* (2006.01)
*G02B 6/42* (2006.01)
*H01L 23/40* (2006.01)

(52) U.S. Cl.
CPC .............. *H01L 23/473* (2013.01); *H01L 23/36* (2013.01); *H01L 23/3672* (2013.01); *H01L 23/4006* (2013.01); *H01L 23/467* (2013.01); *G02B 6/4286* (2013.01); *H01L 2023/4087* (2013.01)

(58) Field of Classification Search
USPC .................. 257/726, 727, E33.075, E31.131, 257/E23.051, E23.08–E23.113, 257/E23.169–E23.178, 710, 276, 625, 675, 257/706, 707, 712–722, 796; 174/548; 361/679.46, 679.47, 679.54, 697–704, 361/676, 678
See application file for complete search history.

(56) References Cited

U.S. PATENT DOCUMENTS 6,396,967 B1     5/2002   Suzuki et al.
6,661,666 B1 *  12/2003   Dauksher ....................... 361/719
7,269,015 B2 *   9/2007   Hornung et al. ............... 361/704

FOREIGN PATENT DOCUMENTS

JP          2000-269545 A        9/2000

* cited by examiner

*Primary Examiner* — Jasmine Clark
(74) *Attorney, Agent, or Firm* — Crowell & Moring LLP

(57) ABSTRACT

To efficiently cool an IC chip and a transmission module disposed on the same substrate, a mounting structure of transmission module of the present invention includes a motherboard, a package substrate mounted on the motherboard, an IC chip and a plurality of connectors disposed on a mounting surface of the package substrate, a plurality of transmission modules connected to the plurality of connectors, and module cooling members having a plurality of slits provided along an connector array direction. The connectors are disposed inside the slits of module cooling members, and the transmission modules can be connected to and disconnected from the connectors disposed through the slits. The transmission modules connected to the connectors are in contact with inside surfaces of the slits and thermally connected to the cooling members.

13 Claims, 11 Drawing Sheets

MOUNTING STRUCTURE OF TRANSMISSION MODULE

CROSS-REFERENCE TO RELATED APPLICATION

The present application claims priority from Japanese Patent Application No. 2013-229133 filed on Nov. 5, 2013, the content of which is hereby incorporated by reference into this application.

TECHNICAL FIELD OF THE INVENTION

The present invention relates to a structure for mounting a transmission module on a substrate included in a server, a network device, etc.

BACKGROUND OF THE INVENTION

Developments of miniaturized and high-speed semiconductor devices (IC (Integrated circuit) chips) used in a server, a network device, etc. have been progressing year by year. Further, along with the developments of miniaturized and high-speed IC chips, a rate of signals inputted and outputted into/from the IC chips has also been increased, so that the signal rate in the next generation IC chips is expected to be 25 Gbit/sec per channel.

Along with the increases of a signal rate described above, a large transmission loss is generated even in transmission at a relatively short distance (about 30 cm), thereby deteriorating signals. For example, a large transmission loss is generated between an IC chip and another IC chip mounted on the same substrate, or between an IC chip and a transmission module such as an optical transceiver, thereby deteriorating the signals. In the wiring on a printed circuit board, a transmission loss of 0.8 dB/cm is usually generated, and a transmission loss of about 0.4 dB/cm is generated even in the wiring on an expensive substrate formed of a resin for high-rate signals. In order to reduce the transmission loss and to suppress the signal deterioration, there is a method of using a special substrate (for example, ceramic substrate) formed of more expensive resins, but the effect thereof is limited.

Further, when a substrate on which an IC chip is mounted is mounted on another substrate, signals are deteriorated caused by the transmission from the substrate on which an IC chip is mounted to another substrate. In the following description, a substrate on which an IC chip is mounted will be called as "package substrate", and an IC chip and a package substrate will be collectively called as "IC package" in some cases. Moreover, a substrate on which an IC package is mounted will be called as "motherboard" to be distinguished from the package substrate in some cases. However, the naming and the distinction described above are used only for the sake of convenience in the explanation.

Further, a build-up substrate including a core layer therein is usually used in the package substrate, and a signal transmission between the IC package and the motherboard is performed through a through-hole provided in the package substrate (build-up board). However, the through-hole often causes signal deteriorations. Moreover, since a size (diameter) of the through-hole cannot be reduced in a core layer, it is difficult, while maintaining wiring density, to maintain good transmission property.

Further, a high-performance and large-scale IC includes a large number (several thousands) of connection pins. Then, the IC package including the large-scale IC is often connected to the motherboard through two-dimensionally arrayed connectors (sockets) called as an LGA (Land Grid Array). However, it is not easy to let high-rate signals (25 Gbit/sec) pass through the LGA. Moreover, when the IC package and the motherboard are connected to each other through the two-dimensionally arrayed LGA, a through-hole connection is inevitable so as to output signals from a land on the motherboard to another IC or another module. However, it has already been described above that the through-hole contributes to signal deteriorations.

For the reasons described above, the signals are greatly deteriorated even in transmission at a short distance (about 30 cm), and an expensive compensation circuit having large power consumption is required for compensating such deterioration.

Therefore, a technique of mounting a transmission module on the package substrate on which an IC chip is mounted has been proposed in Japanese Patent Application Laid-Open Publication No. 2000-269545 (Patent Document 1). When the transmission module is mounted on the package substrate, a distance between the IC chip and the transmission module is shorter. That is, a signal transmission distance is shorter. Moreover, the signals can be transmitted between the IC chip and the transmission module without through a core layer.

SUMMARY OF THE INVENTION

However, heat is generated in both an IC chip and a transmission module during the operation. Therefore, when the both are disposed close to each other, the heat quantity is increased. Moreover, the IC chip has larger power consumption and larger heat quantity than those of the transmission module. On the other hand, the transmission module has a lower heat-resistant temperature than that of the IC chip. That is, when the IC chip and the transmission module are disposed on the same substrate, the transmission module having a low heat-resistant temperature is disposed close to the IC chip having large heat quantity. Therefore, it is required to improve cooling effects for the IC chip and the transmission module.

It is an object of the present invention to provide a mounting structure capable of effectively cooling an IC chip and a transmission module disposed on the same substrate.

A mounting structure of transmission module of the present invention includes: a first substrate; a second substrate mounted on the first substrate; an IC chip mounted on a mounting surface of the second substrate; a plurality of connectors disposed on the mounting surface of the second substrate and around the IC chip; each of a plurality of transmission modules connected to each of the plurality of connectors; and a cooling member including a plurality of slits provided along an array direction of the plurality of connectors. The connector is disposed inside the slit of the cooling member, and the transmission module can be connected to and disconnected from the connector disposed inside the slit through the slit. The transmission module connected to the connector is in contact with inside surfaces of the slit and thermally connected to the cooling member.

In one aspect of the present invention, a module cooling member that includes the slit and is thermally connected to the transmission module, and a chip cooling member that is in contact with the IC chip and thermally connected to the IC chip are provided. The module cooling member and the chip cooling member are not in contact with each other but are thermally separated from each other.

In another aspect of the present invention, the module cooling member and the chip cooling member are disposed on a same plane.

In another aspect of the present invention, the module cooling member and the chip cooling member are disposed on different planes.

In another aspect of the present invention, a first connector row including a plurality of connectors arrayed along a first side of the IC chip; a second connector row including a plurality of connectors arrayed along a second side of the IC chip; a first module cooling member thermally connected to the transmission module that is connected to the connector included in the first connector row; and a second module cooling member thermally connected to the transmission module that is connected to the connector included in the second connector row are provided. The chip cooling member includes a heat absorption unit overlapped with the IC chip, and a heat radiation unit connected to the heat absorption unit.

In another aspect of the present invention, the first module cooling member and the second module cooling member are disposed so as to be opposed to each other across the IC chip. The heat absorption unit of the chip cooling member is extended along the first connector row and the second connector row between the first module cooling member and the second module cooling member. The two heat radiation units are connected to both ends of the heat absorption unit in a longitudinal direction.

In another aspect of the present invention, a third connector row including a plurality of connectors arrayed along a third side of the IC chip; a fourth connector row including a plurality of connectors arrayed along a fourth side of the IC chip; a third module cooling member thermally connected to the transmission module connected to the connector included in the third connector row; and a fourth module cooling member thermally connected to the transmission module connected to the connector included in the fourth connector row are provided. The first module cooling member, the second module cooling member, the third module cooling member and the fourth module cooling member are disposed so as to surround the IC chip. The heat absorption unit of the chip cooling member is disposed inside the first module cooling member, the second module cooling member, the third module cooling member and the fourth module cooling member. The heat radiation unit of the chip cooling member is disposed above the first module cooling member, the second module cooling member, the third module cooling member and the fourth module cooling member, and covers at least a part of the first, second, third and fourth module cooling members.

In another aspect of the present invention, a plurality of heat radiation fins in parallel with each other are provided in each of the module cooling member and the chip cooling member.

In another aspect of the present invention, an optical fiber extending from the transmission module is passed through between the heat radiation fins provided in the module cooling member.

In another aspect of the present invention, an air-cooling fan is provided, the module cooling member is disposed at an upstream side of cooling air generated by the air-cooling fan, and the chip cooling member is disposed at a downstream side thereof.

In another aspect of the present invention, the cooling member is a liquid-cooling member, and thermally connected to both of the transmission module and the IC chip.

In another aspect of the present invention, the cooling member includes a heat-exchanger having an inlet into which a liquid coolant is flowed and an outlet from which a liquid coolant is flowed. The heat-exchanger is overlapped with the IC chip, and a plurality of slits are provided along at least one side of the heat-exchanger.

In another aspect of the present invention, a flow path that connects the inlet and the outlet is formed in the heat-exchanger. An upstream side of the flow path is closer to the transmission module than a downstream side of the flow path, and a downstream side of the flow path is closer to the IC chip than an upstream side of the flow path.

According to the present invention, a mounting structure capable of effectively cooling an IC chip and a transmission module disposed on the same substrate is achieved.

BRIEF DESCRIPTIONS OF THE DRAWINGS

DESCRIPTIONS OF THE PREFERRED EMBODIMENTS

First Embodiment

Figure 1:
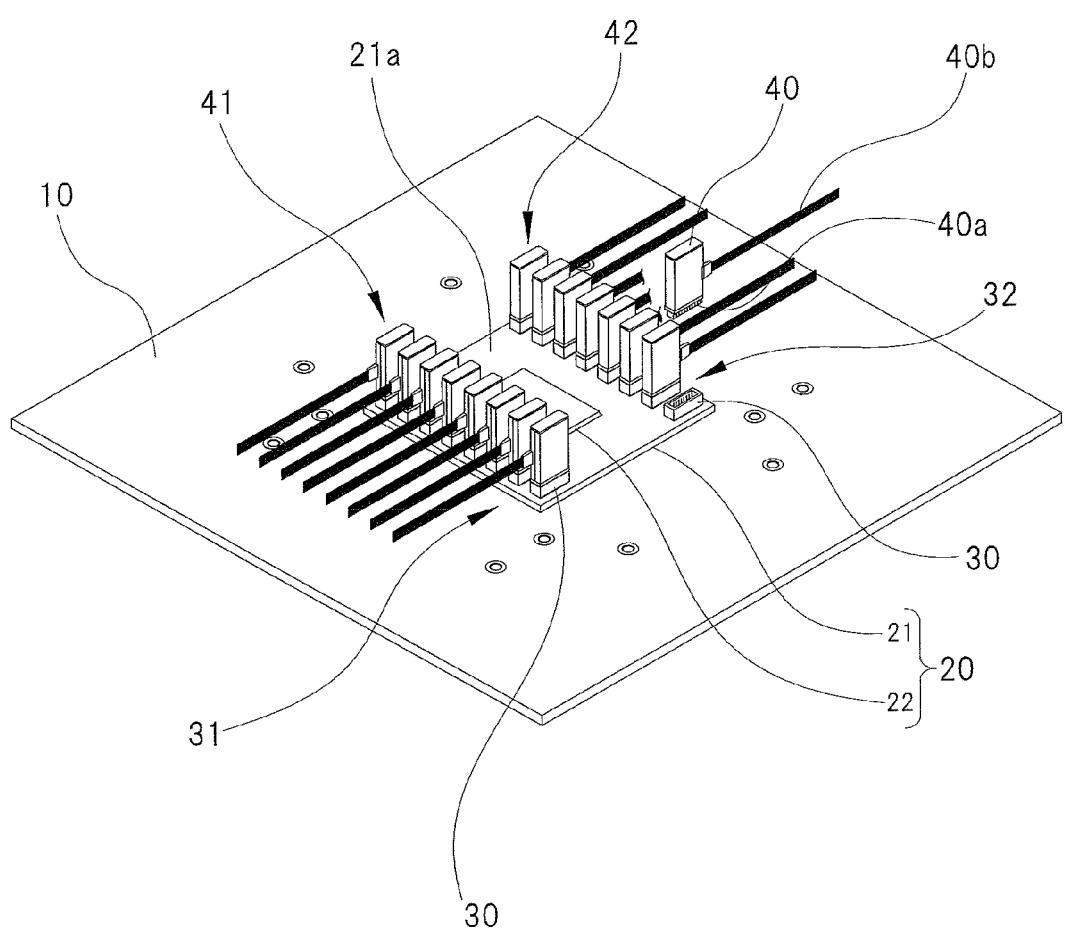
FIG. 1 is a perspective view illustrating an example of a state in which a motherboard, an IC chip and a transmission module are disposed.

Hereinafter, a first embodiment of a mounting structure of transmission module of the present invention will be described in detail. As illustrated in FIG. 1, in the present embodiment, an IC package 20 is mounted on a motherboard 10 as a first substrate. The IC package 20 includes a package substrate 21 as a second substrate, and an IC chip 22 mounted on a mounting surface 21a of the package substrate 21.

The IC chip 22 is mounted substantially in the center of the mounting surface 21a of the package substrate 21, and a plurality of connectors 30 are disposed around the IC chip 22. In other words, the plurality of connectors 30 are mounted on the mounting surface 21a of the package substrate 21 and around the IC chip 22. That is, the IC chip 22 and the connectors 30 are disposed on the same substrate and close to each other. In the present embodiment, a distance (transmission distance) between the IC chip 22 and each connector 30 is several centimeters.

Each connector 30 is a female connector, and electrically connected to the IC chip 22 through wires (not illustrated) formed in the mounting surface 21a of the package substrate 21. On the other hand, a male connector 40a, which can be connected to and disconnected from the connectors 30, is provided at a bottom surface of each transmission module 40. When the male connector 40a included in the transmission module 40 is connected to the connector 30 (female connector), the IC chip 22 and the transmission module 40 are electrically connected to each other through the connector 30.

As described above, a distance between the IC chip 22 and each connector 30 is several centimeters; so that a distance (transmission distance) between the IC chip 22 and each transmission module 40 connected to each connector 30 is also several centimeters. Further, the IC chip 22 and each transmission module 40 are connected to each other through the wires formed in the mounting surface 21a of the package substrate 21, but not through a through-hole having a large transmission loss.

Each transmission module 40 includes light-emitting elements and drive circuits, and the light-emitting elements are driven based on electronic signals to be inputted through the connector 30. That is, each transmission module 40 is an optical communication module (optical transceiver) that converts electronic signals outputted from the IC chip 22 into optical signals.

In the present embodiment, the eight connectors 30 are arrayed along a first side of the IC chip 22. Further, the eight connectors 30 are also arrayed along a second side of the IC chip 22 opposed to the first side. In the following description, in some cases, a row of connectors including the eight connectors 30 arrayed along the first side will be called as "a first connector row 31", and a row of connectors including the eight connectors 30 arrayed along the second side will be called as "a second connector row 32". Moreover, in some cases, the eight transmission modules 40 connected to each connector 30 included in the first connector row 31 will be collectively called as "a first module group 41", and each of the eight transmission modules 40 connected to each connector 30 included in the second connector row 32 will be collectively called as "a second module group 42".

Figure 2:
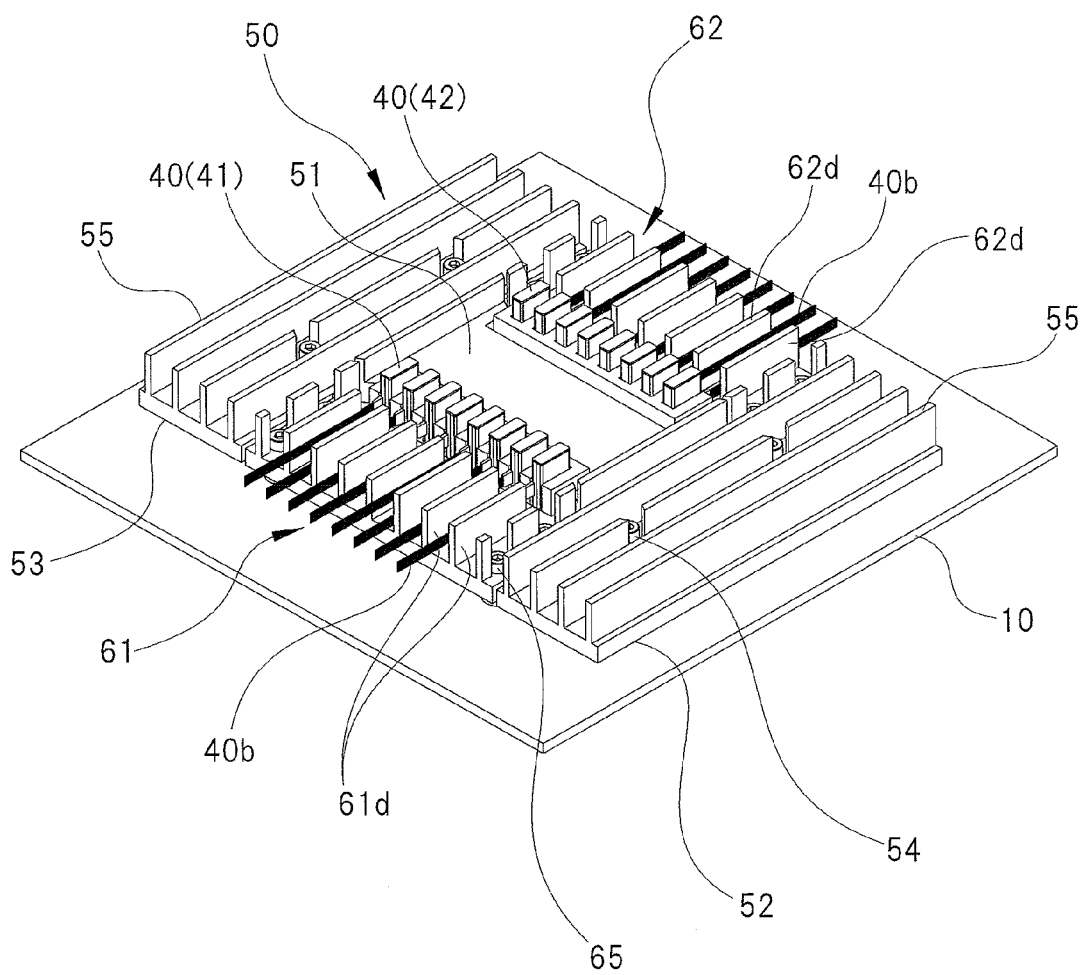
FIG. 2 is a perspective view illustrating a first embodiment of the present invention.

Herein, heat is generated in the IC chip 22 and the transmission module 40 during the operation. Further, the IC chip 22 has larger heat quantity than that of the transmission module 40. On the other hand, the transmission module 40 has a lower heat-resistant temperature than that of the IC chip 22. Therefore, in the present embodiment, a cooling member (chip cooling member) for cooling the IC chip 22 and a cooling member (module cooling member) for cooling the transmission module 40 are provided. Specifically, as illustrated in FIG. 2, a chip cooling member 50 for cooling the IC chip 22 (FIG. 1), a first module cooling member 61 for cooling the first module group 41 and a second module cooling member 62 for cooling the second module group 42 are provided. Hereinafter, each of the chip cooling member 50, the first module cooling member 61 and the second module cooling member 62 will be described in detail. However, the first module cooling member 61 and the second module cooling member 62 are substantially the same in shape and structure; therefore, the first module cooling member 61 will be described in detail, while the description of the second module cooling member 62 will be optionally omitted.

Figure 3:
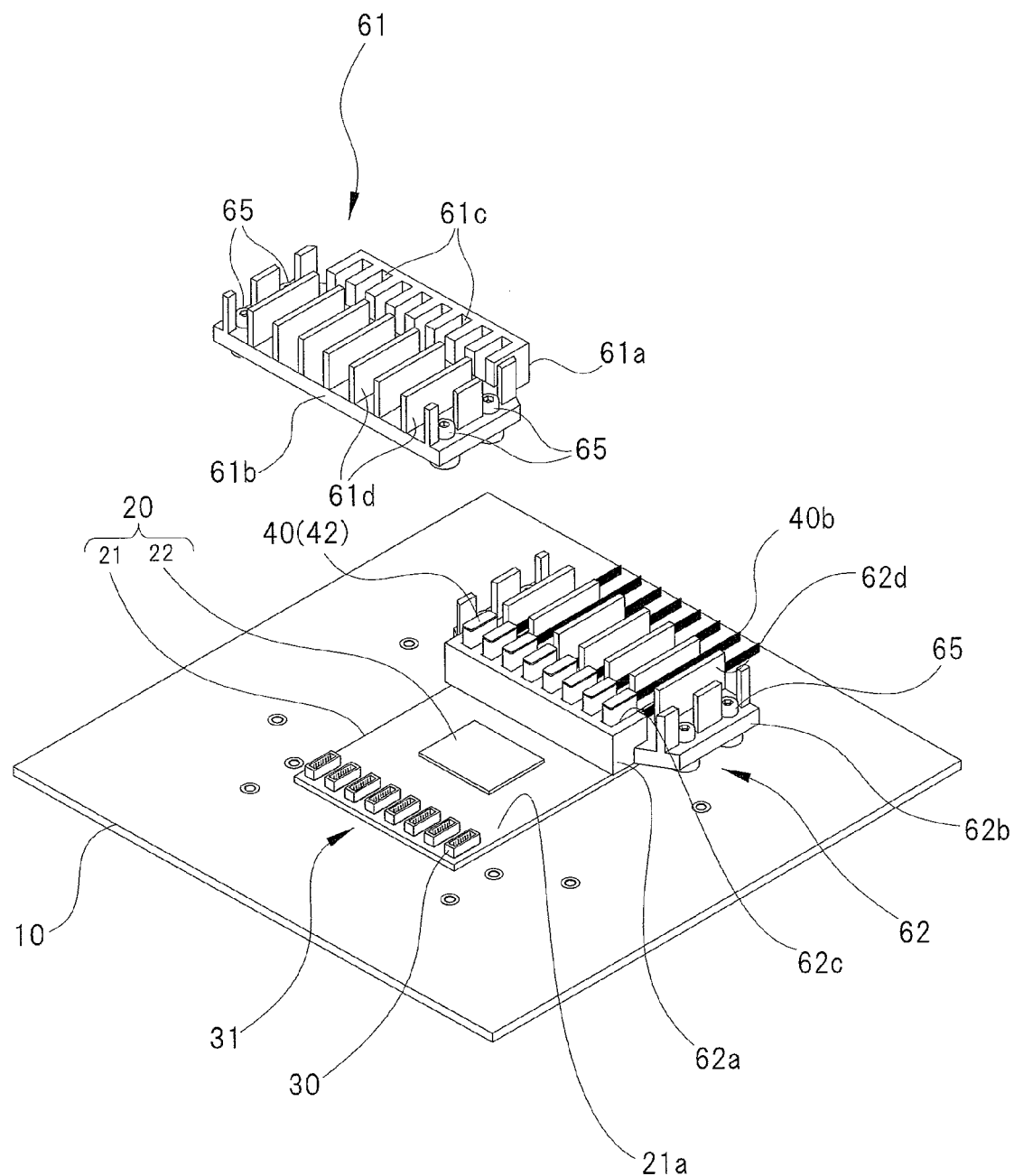
FIG. 3 is a perspective view illustrating a module cooling member.

With reference to FIG. 3, the first module cooling member 61 is formed of a metal material (aluminum in the present embodiment) having high heat conductivity. The first module cooling member 61 includes a block-shaped heat absorption unit 61a and a plate-shaped heat radiation unit 61b extending behind the heat absorption unit 61a. A plurality of slits 61c are provided in the heat absorption unit 61a along an array direction of the connectors 30 (hereinafter, "connector array direction") included in the first connector row 31, and a plurality of heat radiation fins 61d are provided in the heat radiation unit 61b along a connector array direction.

In the first module cooling member 61, the heat absorption unit 61a is disposed so as to be overlapped with the package substrate 21, and the heat radiation unit 61b is disposed so as to be overlapped with the motherboard 10, and the first module cooling member 61 is fixed to the motherboard 10 by bolts 65. Further, each connector 30 included in the first connector row 31 is disposed inside each slit 61c provided in the heat absorption unit 61a. Each slit 61c has an opening in the three sides (upper side, lower side and lateral side) of each slit 61c, thereby making it possible to access to the connector 30 inside the slit 61c from the upper side of each silt 61c. Note that the lateral side of the silt 61c indicates a side facing the heat radiation unit 61b.

Each of the transmission modules 40 is connected to each of the connectors 30. Specifically, the male connector 40a (FIG. 1) included in each transmission module 40 is connected to each connector 30. Upon connection of the transmission module 40 to the connector 30, the transmission module 40 is connected inside the slit 61c from an upper side of the slit 61c, and the male connector 40a projected from a bottom surface of the transmission module 40 is connected to the connector 30. Here, a height of the slit 61c (equal to a height of the heat absorption unit 61a) is lower than that of the transmission module 40. Therefore, when the transmission module 40 is connected to the connector 30 inside the slit 61c, an upper part of the transmission module 40 is projected above the slit 61c, as illustrated in FIG. 2 and FIG. 3. When the transmission module 40 is disconnected from the connector 30, the upper part of the transmission module 40 projected above the slit 61c is picked up with fingers to pull out the transmission module 40. That is, the transmission module 40 can be connected to and disconnected from the connector 30 inside the slit 61c, through the slit 61c provided in the heat absorption unit 61a.

The transmission module 40 connected to the connector 30 is pressed against inside surfaces of the slit 61c by an elastic member (not illustrated). Specifically, the elastic member is provided between one of outside surfaces of the transmission module 40 and one of the inside surfaces of the slit 61c opposed to one of the outside surfaces described above. The other outside surface of the transmission module 40 is pressed against the other inside surface of the slit 61c opposed to the other outside surface described above by a biasing force generated from the elastic member. That is, the transmission module 40 connected to the connector 30 is in contact with the inside surfaces of the slit 61c, and thermally connected to the first module cooling member 61 (heat absorption unit 61a). Therefore, the heat generated from the first module group 41 is propagated from the heat absorption unit 61a of the first module cooling member 61 to the heat radiation unit 61b, and radiated from a surface of the heat radiation fin 61d.

Note that a plate spring or a coil spring is, for example, used as an elastic member. The elastic member may be or may not be integrated with the transmission module 40. For example, a plate spring integrated with the transmission module 40 can be made by bending apart of a plate forming a chassis of the transmission module 40.

Further, as illustrated in FIG. 2, optical fibers 40b extending from the transmission module 40 connected to the connector 30 (FIG. 3) are extracted to an outside of the motherboard 10 by passing through between the adjacent heat radiation fins 61d. Since each optical fiber 40b is passed through between the adjacent heat radiation fins 61d, each optical fiber 40b is orderly wired, so that a correspondence relationship between each transmission module 40 and each optical fiber 40b can be identified at one view. Moreover, since each optical fiber 40b is protected by the heat radiation fin 61d, thereby preventing the optical fiber 40b from being damaged. Especially, in the optical fiber 40b, although the part extracted from the transmission module 40 is likely to be damaged, the part is protected by the heat radiation fin 61d.

The second module cooling member 62 illustrated in FIG. 2 and FIG. 3 has the same shape and structure as those of the first module cooling member 61. The second module cooling member 62 for cooling the second module group 42 is disposed so as to be opposed to the first module cooling member 61 across the IC chip 22. As illustrated in FIG. 3, a plurality of slits 62c are provided in the heat absorption unit 62a of the second module cooling member 62 along an array direction of the connectors 30 (hereinafter, "connector array direction") included in the second connector row 32. Each connector 30 included in the second connector row 32 is disposed inside each slit 62c provided in the heat absorption unit 62a of the second module cooling member 62. Each transmission module 40 included in the second module group 42 is connected to the respective connectors 30 disposed inside each slit 62c. Each transmission module 40 included in the second module group 42 is pressed against inside surfaces of the silt 62c by an elastic member (not illustrated), and thermally connected to the second module cooling member 62 (heat absorption unit 62a). Therefore, the heat generated from the second module group 42 is propagated from the heat absorption unit 62a of the second module cooling member 62 to the heat radiation unit 62b, and radiated from a surface of the heat radiation fin 62d.

Note that, in FIG. 1, the first module cooling member 61 and the second module cooling member 62 both illustrated in FIG. 2 and FIG. 3 are not illustrated so as to illustrate a connection state of the connector 30 and the transmission module 40. In practice, the first module cooling member 61 and the second module cooling member 62 are provided before the transmission module 40 is connected to the connector 30. That is, after the first module cooling member 61 and the second module cooling member 62 are provided, the transmission module 40 is optionally connected to the connector 30 inside the slit 61c and slit 62c respectively provided in the first module cooling member 61 and the second module cooling member 62.

Figure 4:
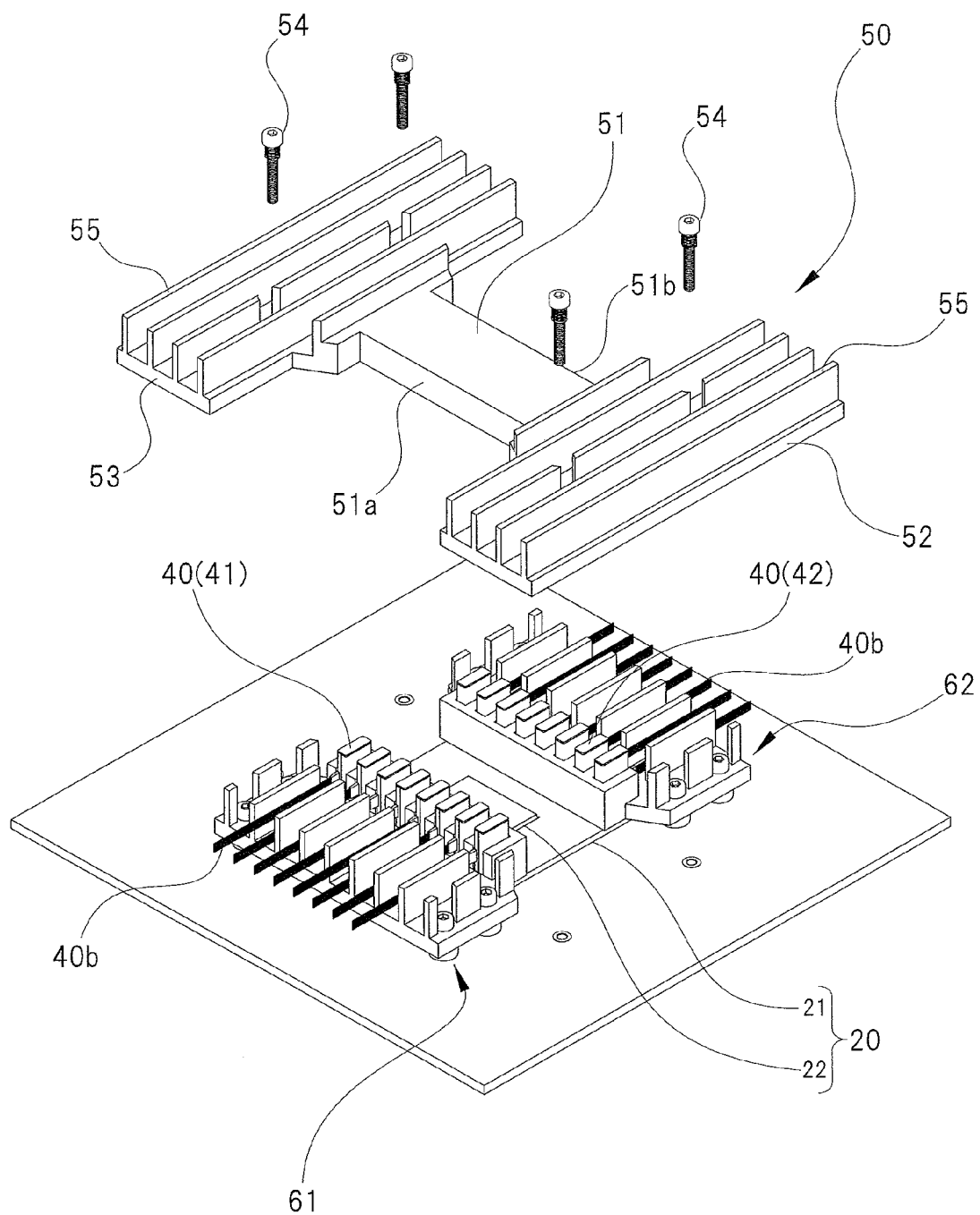
FIG. 4 is a perspective view illustrating a chip cooling member.

Next, the chip cooling member 50 illustrated in FIG. 2 will be described in detail. As illustrated in FIG. 4, the chip cooling member 50 includes a heat absorption unit 51 and the two radiation units 52 and 53 that are connected to both ends of the heat absorption unit 51 in a longitudinal direction, and the chip cooling member 50 has an H-like shape when seen in a plan view.

In the chip cooling member 50, the heat absorption unit 51 is disposed so as to be overlapped with the IC chip 22, and the chip cooling member 50 is fixed to the motherboard 10 by bolts 54. Therefore, the heat absorption unit 51 of the chip cooling member 50 is extended along a connector array direction between the first module cooling member 61 and the second module cooling member 62 opposed to each other (see FIG. 2). Further, the two radiation units 52 and 53 connected to both ends of the heat absorption unit 51 in a longitudinal direction are opposed to each other across the first module cooling member 61 and the second module cooling member 62 (see FIG. 2). In other words, the first module cooling member 61 is disposed in space surrounded by a first side surface 51a of the heat absorption unit 51 and side surfaces of the two radiation units 52 and 53 connected to the first side surface 51a, as illustrated in FIG. 4. Moreover, the second module cooling member 62 is disposed in space surrounded by a second side surface 51b of the heat absorption unit 51 and side surfaces of the two radiation units 52 and 53 connected to the second side surface 51b. As a result, as illustrated in FIG. 2, the first module cooling member 61, the second module cooling member 62 and the chip cooling member 50 are substantially disposed on the same plane, and they have a substantially rectangular planar shape overall. However, a gap is provided between the first module cooling member 61 and the chip cooling member 50, and a gap is also provided between the second module cooling member 62 and the chip cooling member 50. That is, the first module cooling member 61, the second module cooling member 62 and the chip cooling member 50 are not in contact with each other.

A bottom surface of the heat absorption unit 51 of the chip cooling member 50, which is overlapped with the IC chip 22, is in contact with an upper surface of the IC chip 22. That is, the chip cooling member 50 is in contact with the IC chip 22, and thermally connected to the IC chip 22. On the other hand, a plurality of heat radiation fins 55 are provided along a connector array direction in the two radiation units 52 and 53 connected to the heat absorption unit 51. Therefore, the heat generated from the IC chip 22 is propagated from the heat absorption unit 51 of the chip cooling member 50 to the heat radiation units 52 and 53, and radiated from a surface of the heat radiation fin 55.

It has been already described above that the plurality of heat radiation fins 61d and 62d provided in the first module cooling member 61 and the second module cooling member 62 are arrayed along a connector array direction. That is, the heat radiation fins 55 provided in the chip cooling member 50 and the heat radiation fins 61d and 62d provided in the first module cooling member 61 and the second module cooling member 62 are in parallel with each other. Further, the heights of the heat radiation fins 55, 61d and 62d are equal to each other (see FIG. 2).

As described above, in the present embodiment, the heat generated from the first module group 41 is radiated through the first module cooling member 61, the heat generated from the second module group 42 is radiated through the second module cooling member 62, and the heat generated from the IC chip 22 is radiated through the chip cooling member 50. In other words, the first module group 41 is cooled by the first module cooling member 61, the second module group 42 is cooled by the second module cooling member 62, and the IC chip 22 is cooled by the chip cooling member 50. Therefore, the plurality of transmission modules 40, which are disposed in the IC chip 22 and around the IC chip 22, are efficiently cooled.

Further, in the present embodiment, the first module cooling member 61 that cools the first module group 41, the second module cooling member 62 that cools the second module group 42 and the chip cooling member 50 that cools the IC chip 22 are not in contact with each other and thermally separated from each other. Therefore, the transmission module 40 is not heated by the heat generated from the IC chip 22.

In addition, the transmission module 40 can be connected to and disconnected from the connector 30 through the slits 61c and 62c provided in the first module cooling member 61 and the second module cooling member 62. That is, the transmission module 40 can be connected to and disconnected from the connector 30 at any time, and it is not required to remove the first module cooling member 61 and the second module cooling member 62 so as to connect/disconnect the transmission module 40 to/from the connector 30.

Second Embodiment

Hereinafter, a second embodiment of the present invention will be described in detail. However, the description of the same members or the substantially same members already described in the first embodiment will be omitted using the same reference numerals.

Figure 5:
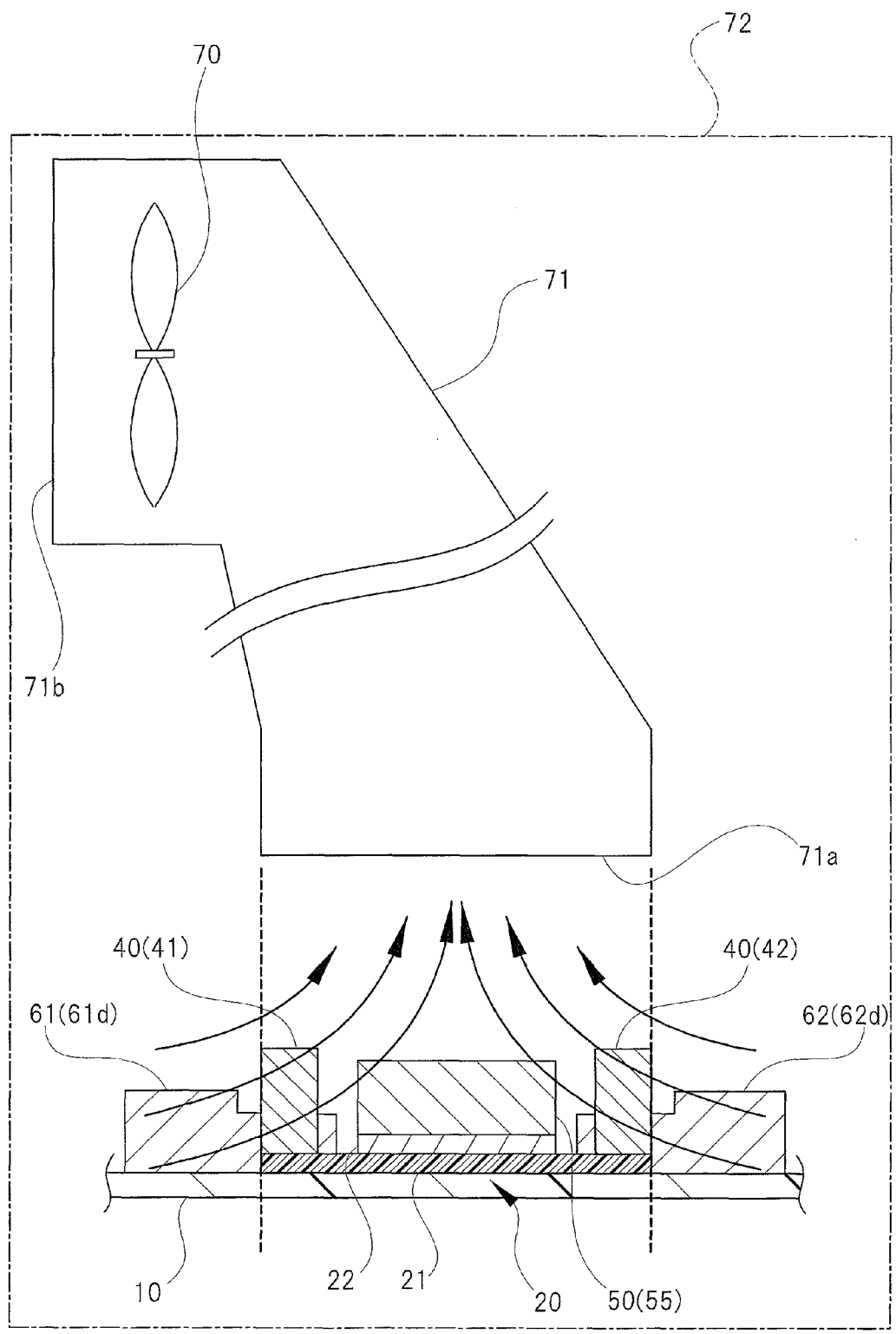
FIG. 5 is a schematic view illustrating a second embodiment of the present invention.

In the present embodiment, as illustrated in FIG. 5, an axial fan 70 as an air-cooling fan and a duct 71 as a flow path forming member are provided. The axial fan 70 and the duct 71 are provided inside a server housing the motherboard 10 or inside a chassis 72 of a network device.

The duct 71 includes an inlet 71a and an outlet 71b, and the inlet 71a of the duct 71 is disposed above the motherboard 10. Specifically, the inlet 71a of the duct 71 is disposed above the chip cooling member 50 overlapped with the IC package 20. More specifically, a center of the inlet 71a of the duct 71 is coincident with, or substantially coincident with a center of the chip cooling member 50, and the chip cooling member 50 is provided in a projection area of the inlet 71a with respect to the motherboard 10.

When the axial fan 70 is rotated, flow of cooling air is generated in the chassis 72. That is, when the axial fan 70 disposed close to the outlet 71b of the duct 71 is rotated, air in the chassis 72 is suctioned into the duct 71 from the inlet 71a. The air suctioned into the duct 71 is flowed from the outlet 71b to the outside of the duct 71 through the axial fan 70. The outlet 71b of the duct 71 is disposed close to an outtake (not illustrated) provided in the chassis 72 and most of the air flowed from the outlet 71b is discharged from the outtake to the outside of the chassis 72. As described above, when air in the chassis 72 is discharged to the outside of the chassis 72, outer air is introduced into the chassis 72 from an intake (not illustrated) provided in the chassis 72.

Herein, the first module group 41 and the second module group 42 are disposed around the IC chip 22. Similarly, the first module cooling member 61 that cools the first module group 41 and the second module cooling member 62 that cools the second module group 42 are disposed around the chip cooling member 50 that cools the IC chip 22. Then, the whole of the chip cooling member 50 is positioned in a projection area of the inlet 71a, while only a part of the first module cooling member 61 and the second module cooling member 62 is positioned in the projection area of the inlet 71a. FIG. 5 schematically illustrates the projection area of the inlet 71a to the motherboard 10 by broken lines. That is, the first module cooling member 61 and the second module cooling member 62 are protruded outside the projection area of the inlet 71a.

Therefore, air in the chassis 72 is passed through the chip cooling member 50 after passing through the first module cooling member 61 and the second module cooling member 62, and suctioned into the duct 71 from the inlet 71a. That is, the first module cooling member 61 and the second module cooling member 62 are positioned at an upstream side of cooling air generated by the axial fan 70, and the chip cooling member 50 is positioned at a downstream side thereof. FIG. 5 schematically illustrates flow of the cooling air described above by arrows. Herein, the heat radiation fin 61d provided in the first module cooling member 61, the heat radiation fin 62d provided in the second module cooling member 62 and the heat radiation fin 55 provided in the IC chip 22 are in parallel with each other, so that the cooling air flows smoothly.

By the layout described above, the IC chip 22 is cooled by cooling air after the transmission module 40 is cooled thereby. In other words, the cooling air of which the temperature is increased by cooling the IC chip 22 is not used for cooling the transmission module 40.

That is to say, in the present embodiment, the cooling air having a lower temperature is supplied to the transmission module 40 having a lower heat-resistant temperature than that of the IC chip 22.

Note that a positional relationship of the inlet 71a, the chip cooling member 50, the first module cooling member 61 and the second module cooling member 62 each illustrated in FIG. 5 is merely an example. For example, when the first module cooling member 61 and the second module cooling member 62 are disposed at an upstream side of cooling air and when the chip cooling member 50 is disposed at a downstream side thereof, the whole of the first module cooling member 61 and the second module cooling member 62 may be positioned in a projection area of the inlet 71a. Further, when the first module cooling member 61 and the second module cooling member 62 are disposed at an upstream side of the cooling air and when the chip cooling member 50 is disposed at a downstream side thereof, a part of the chip cooling member 50 may be protruded outside the projection area of the inlet 71a.

Further, a flow path forming member is not limited to a duct. For example, a flow path of cooling air may be formed by a rib and other members, or a flow path of cooling air may be formed by combining a duct, a rib and other members.

Third Embodiment

A third embodiment of the present invention will be described in detail. However, the description of the same members or the substantially same members already described in the first embodiment or the second embodiment will be omitted using the same reference numerals.

In the present embodiment, in addition to the first connector row 31 and the second connector row 32 illustrated in FIG. 1, a third connector row and a fourth connector row are provided. The third connector row includes eight connectors (not illustrated) arrayed along a third side of the IC chip 22 illustrated in FIG. 6, and the fourth connector row includes eight connectors (not illustrated) arrayed along a fourth side of the IC chip 22. Each connector included in the third connector row and the fourth connector row is the same as the connectors 30 illustrated in FIG. 1 and FIG. 3. Further, each of the transmission modules 40 is connected to each of the connectors included in the third connector row and the fourth connector row. In the following description, the eight transmission modules 40 connected to the connectors included in the third connector row are collectively called as "a third module group 43", and the eight transmission modules 40 connected to the connectors included in the fourth connector row are collectively called as "a fourth module group 44". In other words, as illustrated in FIG. 6, the third connector row is formed by the connectors (not illustrated) to which the third module group 43 is connected, and the fourth connector row is formed by the connectors (not illustrated) to which the fourth module group 44 is connected.

Further, in the present embodiment, by addition of the connector rows and the module groups, the module cooling members are also additionally provided. Specifically, as illustrated in FIG. 6, a third module cooling member 63 that cools the third module group 43 and a fourth module cooling member 64 that cools the fourth module group 44 are provided, in addition to the first module cooling member 61 and the second module cooling member 62.

The third module cooling member 63 and the fourth module cooling member 64 are the same as the first module cooling member 61 and the second module cooling member 62 illustrated in FIG. 3. The third module cooling member 63 is thermally connected to the transmission module 40 included in the third module group 43, and the fourth module cooling member 64 is thermally connected to the transmission module 40 included in the fourth module group 44.

Figure 6:
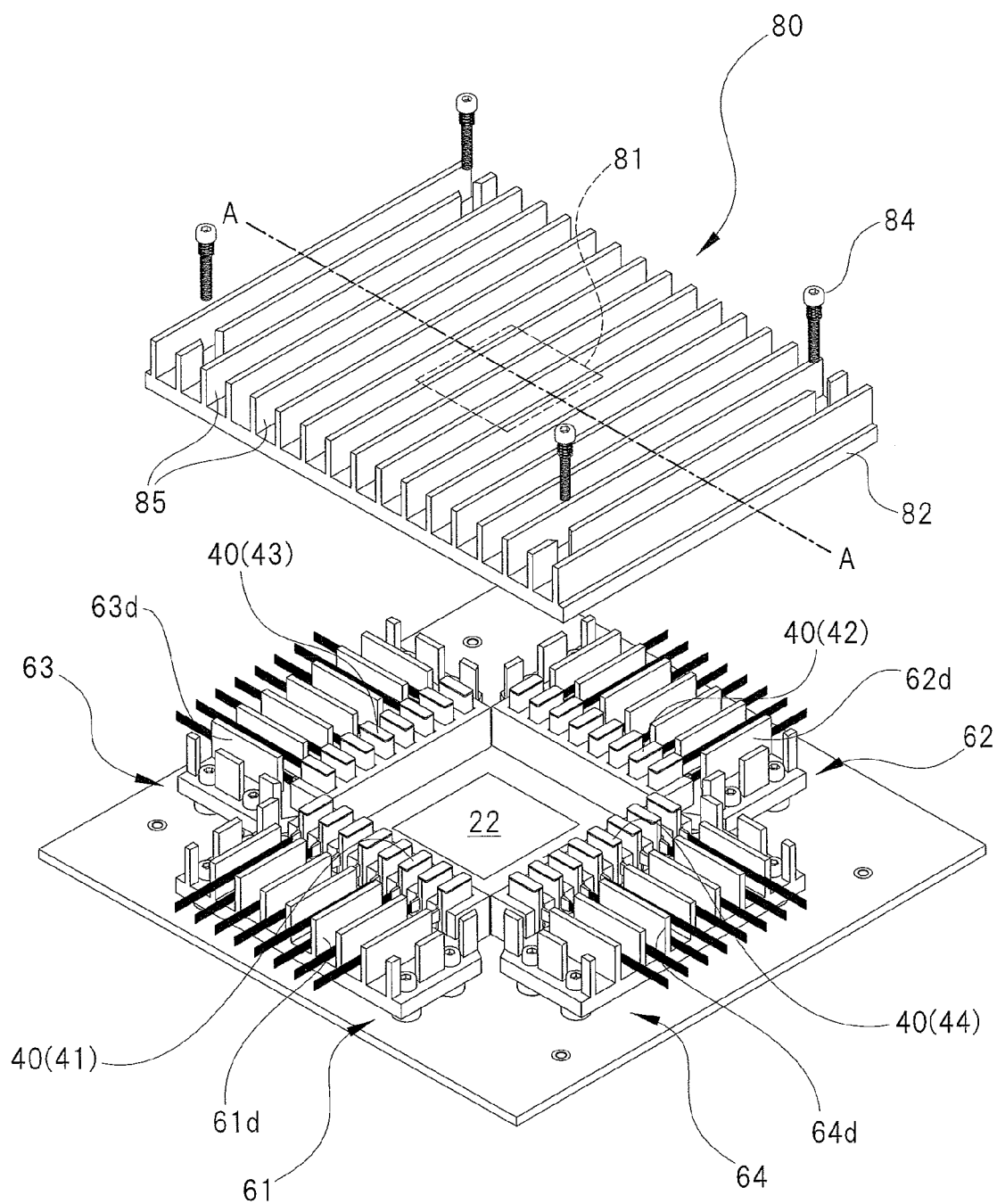
FIG. 6 is a perspective view illustrating a third embodiment of the present invention.

As illustrated in FIG. 6, the first module cooling member 61, the second module cooling member 62, the third module cooling member 63 and the fourth module cooling member 64 are disposed so as to surround the IC chip 22.

As illustrated in FIG. 6, the shape and the size of a chip cooling member 80 in the present embodiment differ from those of the chip cooling member 50 in the first embodiment. However, the chip cooling member 80 in the present embodiment is the member for cooling the IC chip 22, and thermally separated from the module cooling members 61, 62, 63 and 64. That is, there are no substantial differences between the chip cooling member 80 in the present embodiment and the chip cooling member 50 in the first embodiment.

Figure 7:
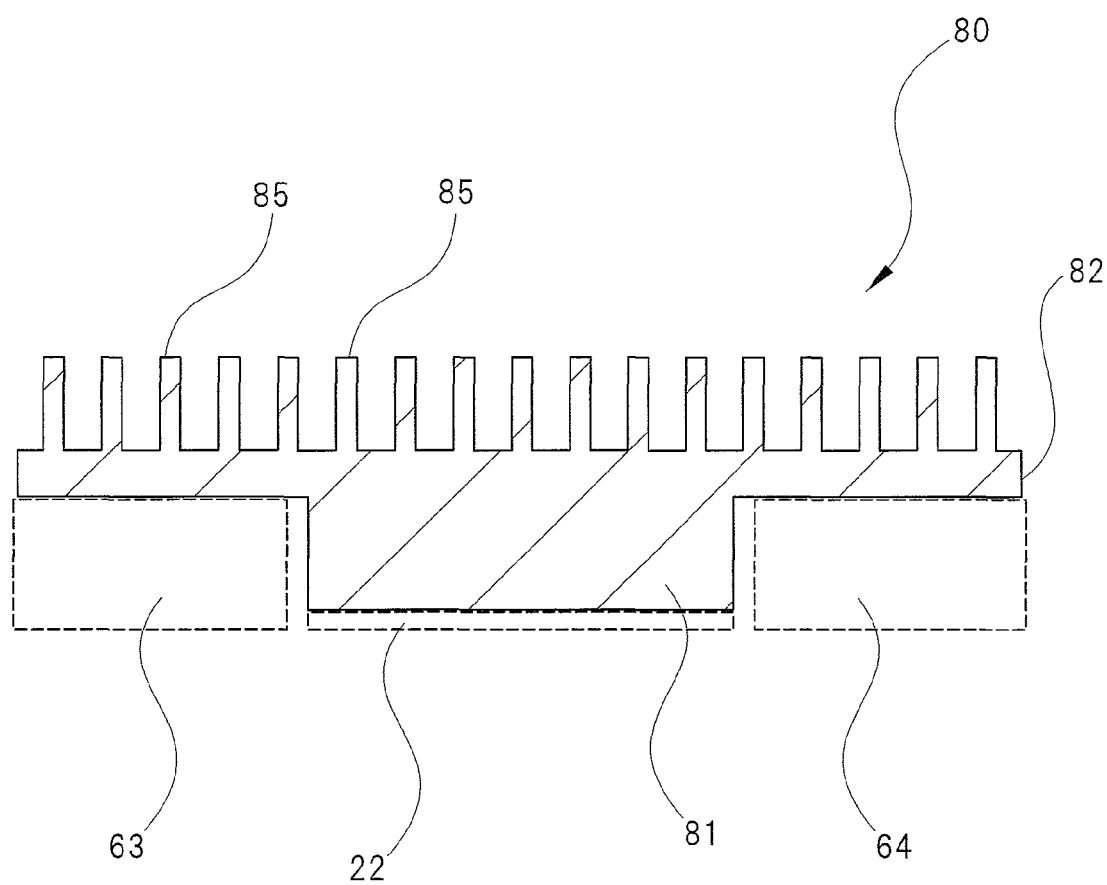
FIG. 7 is a schematic cross-sectional view taken along the line A-A illustrated in FIG. 6.

As illustrated in FIG. 6 and FIG. 7, the chip cooling member 80 in the present embodiment includes a prism-shaped heat absorption unit 81 that is disposed inside the four module cooling members 61, 62, 63 and 64 surrounding the IC chip 22. Further, a heat radiation unit 82 of the chip cooling member 80 is extended in four directions in parallel with the motherboard 10 from one end of the heat absorption unit 81, thereby covering the module cooling members 61, 62, 63 and 64. That is, the heat radiation unit 82 is disposed above the module cooling members 61, 62, 63 and 64 and overlapped with the module cooling members 61, 62, 63 and 64. In other words, in the present embodiment, the module cooling members 61, 62, 63 and 64 and the chip cooling member 80 are disposed on different planes. A plurality of heat radiation fins 85 are formed on an upper surface of the heat radiation unit 82. As illustrated in FIG. 6, the heat radiation fins 85 included in the chip cooling member 80 are in parallel with the heat radiation fins 61d included in the first module cooling member 61 and the heat radiation fins 62d included in the second module cooling member 62. On the other hand, the heat radiation fins 85 included in the chip cooling member 80 are orthogonal to the heat radiation fins 63d included in the third module cooling member 63 and the heat radiation fins 64d included in the fourth module cooling member 64. Note that the chip cooling member 80 is fixed to the motherboard 10 by bolts 84.

As described above, in the present embodiment, the heat radiation unit 82 of the chip cooling member 80 is enlarged as compared with the first embodiment. Therefore, the IC chip 22 having large heat quantity is more efficiently cooled.

Note that in the present embodiment, all of the four module cooling members 61, 62, 63 and 64 are completely covered by the heat radiation unit 82 of the chip cooling member 80. However, only a part of the module cooling member may be covered by the heat radiation unit of the chip cooling member. Further, the module cooling member may be partially covered by the heat radiation unit of the chip cooling member.

Fourth Embodiment

A fourth embodiment of the present invention will be described in detail. However, the description of the same members or the substantially same members already described in the first to the third embodiments will be omitted using the same reference numerals.

Figure 8:
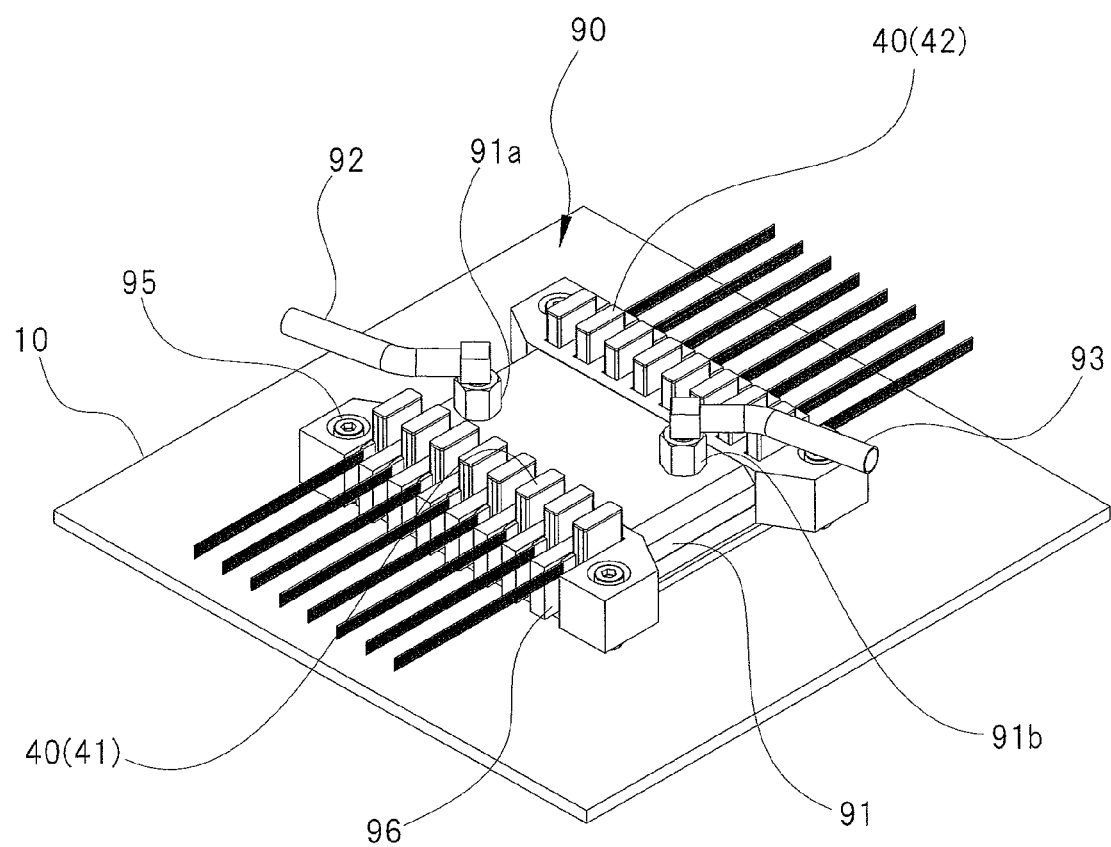
FIG. 8 is a perspective view illustrating a fourth embodiment of the present invention.
Figure 9:
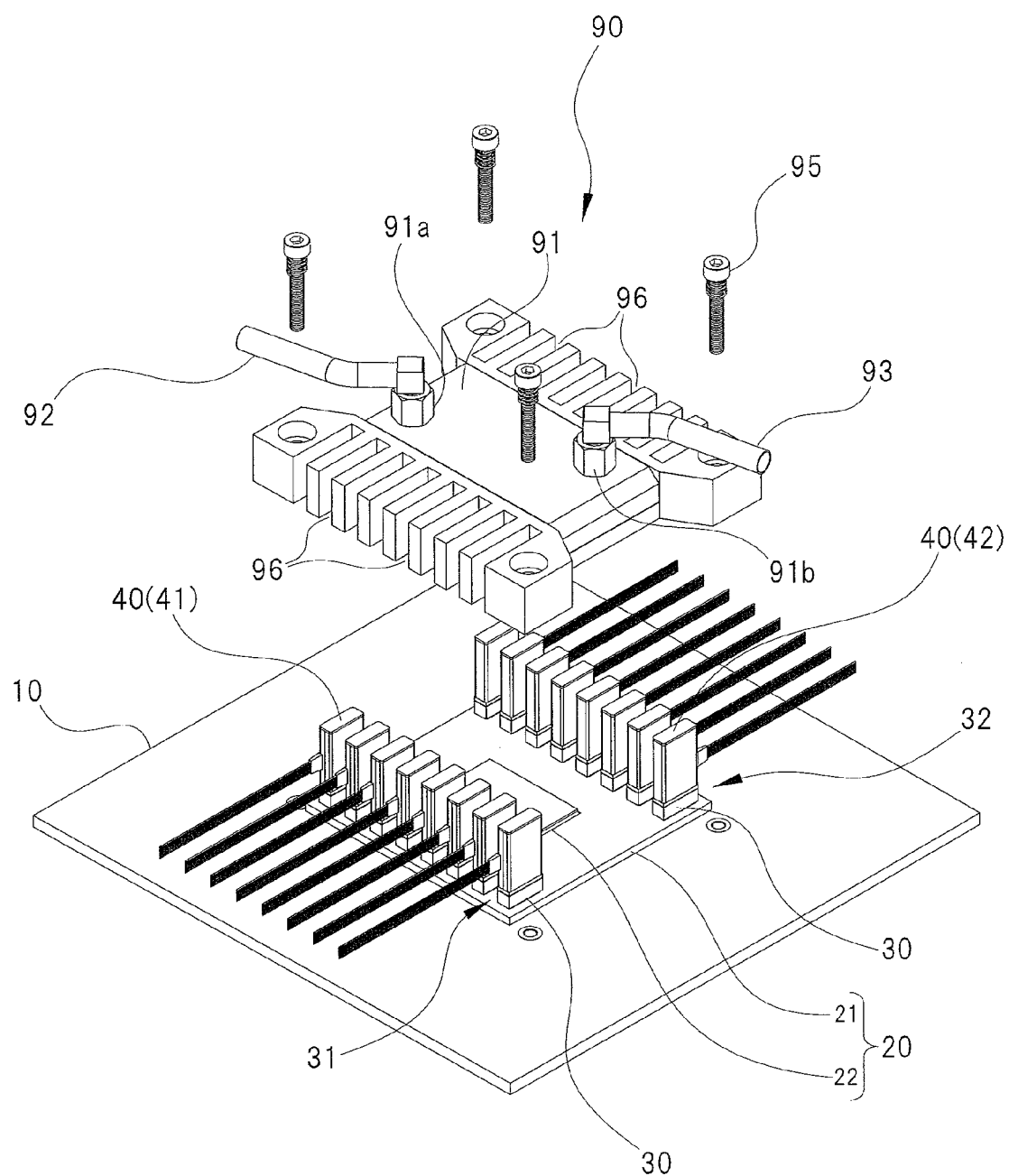
FIG. 9 is another perspective view illustrating the fourth embodiment of the present invention.

In the first to the third embodiments, an air-cooling member is used, but in the present embodiment, a liquid-cooling member is used. As illustrated in FIG. 8 and FIG. 9, a cooling member 90 in the present embodiment includes a heat-exchanger 91 having an entrance 91a into which a liquid coolant is flowed and an exit 91b from which a liquid coolant is flowed. A first pipe 92 forming one part of a circulation path is connected to the entrance 91a of the heat-exchanger 91, and a second pipe 93 forming the other part of the circulation path is connected to the exit 91b of the heat-exchanger 91. The first pipe 92 and the second pipe 93 are connected to a pump (not illustrated). Further, a snake-shaped flow path that connects the entrance 91a and the exit 91b is formed in the heat-exchanger 91.

The liquid coolant discharged from the pump described above is supplied to the entrance 91a of the heat-exchanger 91 through the first pipe 92, and flowed into the flow path in the heat-exchanger 91. The liquid coolant flowed into the flow path is reached to the exit 91b through the flow path, and returned to the pump through the second pile 93. Note that a tank is installed on the circulation path as necessary.

In the cooling member 90, the heat-exchanger 91 is disposed so as to be overlapped with the IC chip 22, and the cooling member 90 is fixed to the motherboard 10 by bolts 95. That is, the IC chip 22 is in contact with a bottom surface of the heat-exchanger 91, and thermally connected to the heat-exchanger 91 (cooling member 90).

A plurality of slits 96 where the connectors 30 included in the first connector row 31 are disposed are formed in a first side of the heat-exchanger 91, and a plurality of slits 96 where the connectors 30 included in the second connector row 32 are disposed are formed in a second side of the heat-exchanger 91 opposed to the first side.

Each of the transmission modules 40 is connected to each of the connectors 30 disposed inside each of the slits 96. The transmission module 40 connected to the connector 30 is in contact with inside surfaces of the slit 96, and thermally connected to the heat-exchanger 91 (cooling member 90). As in the first embodiment, the transmission module 40 is pressed against the inside surfaces of the slit 96 by a biasing force generated from an elastic member. Further, the transmission module 40 can be connected to and disconnected from the connector 30 inside the slit 96 through the silt 96.

Figure 10:
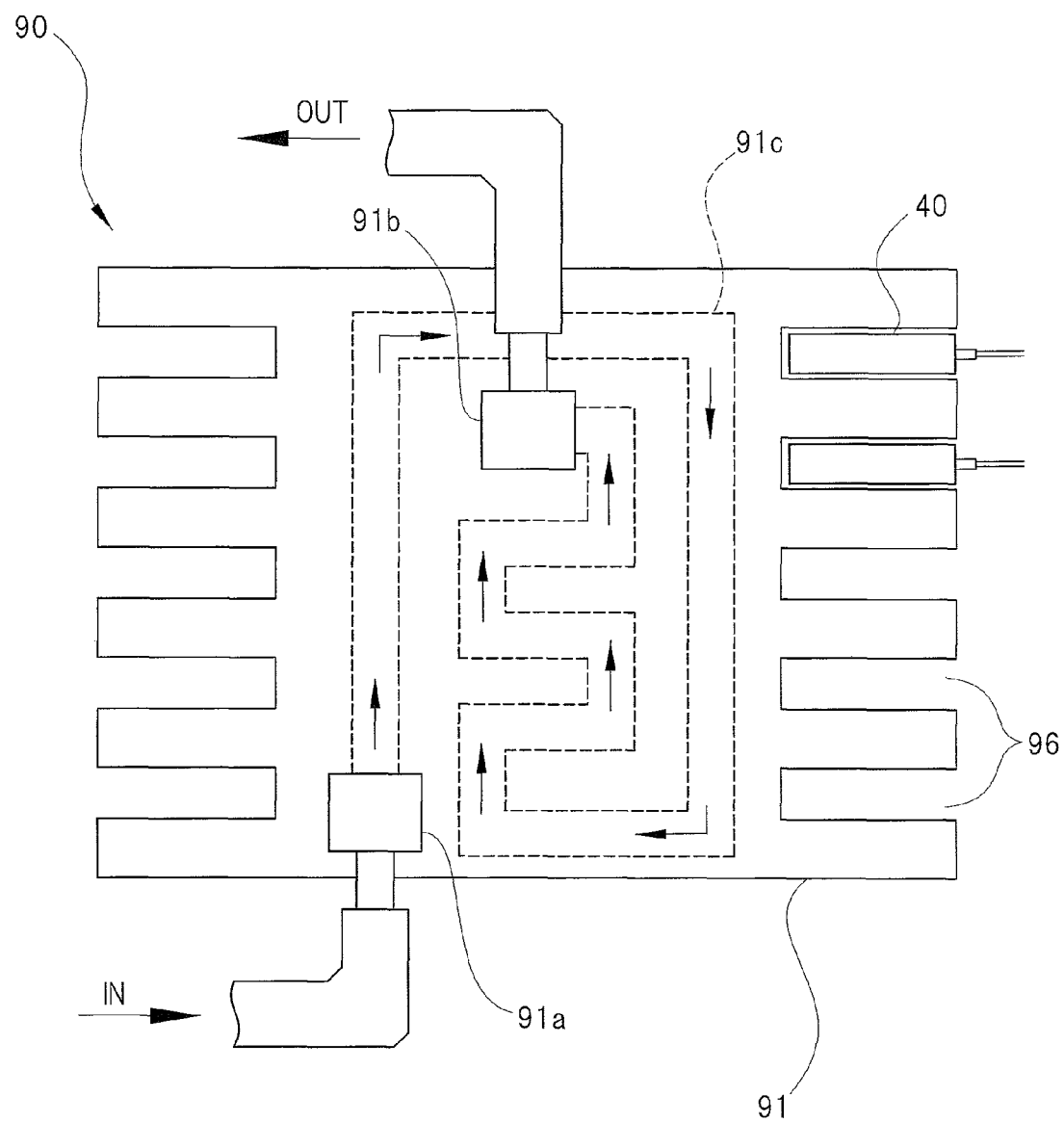
FIG. 10 is a plan view illustrating an example of a layout of a flow path formed in a heat exchanger.
Figure 11:
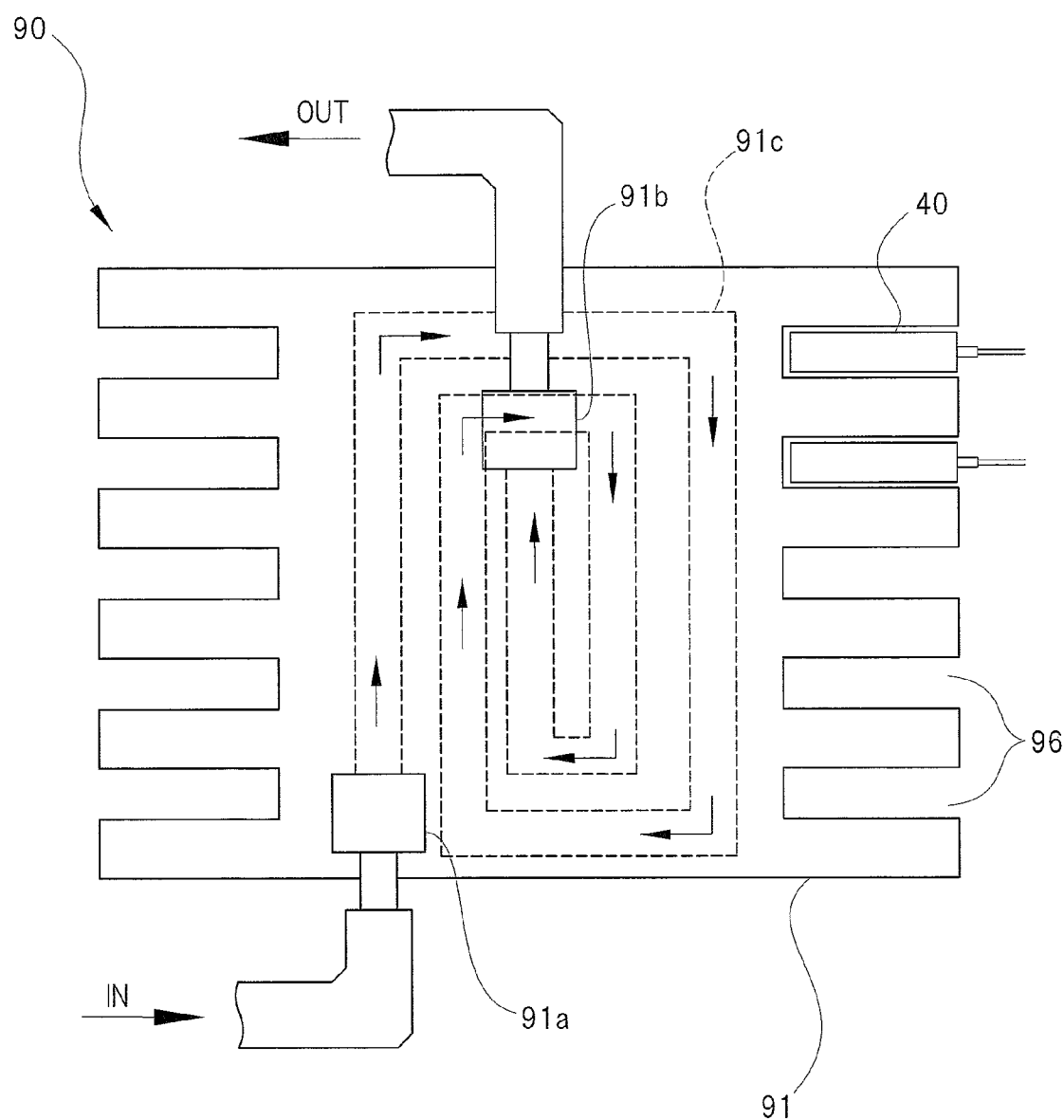
FIG. 11 is a plan view illustrating another example of a layout of a flow path formed in a heat exchanger.

A layout of the flow path formed in the heat-exchanger 91 is not limited. FIG. 10 and FIG. 11 illustrate examples of the layout of the flow path. As illustrated in FIG. 10 and FIG. 11, the entrance 91a and the exit 91b of the heat-exchanger 91 are connected through a flow path 91c. Further, the flow path 91c illustrated in FIG. 10 is snaked in a zigzag manner, and the flow path 91c illustrated in FIG. 11 is sneaked in a spiral manner. However, in both of the flow paths 91c, an upstream side of the flow paths 91c is closer to the transmission module 40 than a downstream side thereof, and the downstream side of the flow paths 91c is closer to the IC chip 22 (FIG. 9) than the upstream side thereof. According to the layout, a temperature of the transmission module 40 is maintained lower than that of the IC chip 22.

As described above, in the present embodiment, one cooling member 90 is thermally connected to both of the transmission module 40 and the IC chip 22. That is, both of the transmission module 40 and the IC chip 22 are cooled by one cooling member 90. However, in the present embodiment in which a liquid-cooling member having a higher cooling performance than an air-cooling member is adopted, both of the transmission module 40 and the IC chip 22 are sufficiently cooled by one cooling member 90. Further, as compared with the embodiments in which an air-cooling member is used, a space that is required for installing a cooling member is reduced in the present embodiment.

In the foregoing, the invention made by the present inventor has been concretely described based on the embodiment. However, it is needless to say that the present invention is not limited to the foregoing embodiment and various modifications and alterations can be made within the scope of the present invention. For example, a transmission module includes an optical communication module that receives optical signals, and an optical communication module that transmits and receives optical signals. The transmission module also includes a communication module that transmits and receives electronic signals. Further, a connector row may be a single row, three rows, or five or more rows.

What is claimed is:

1. A mounting structure of a communication module comprising:
   a first substrate;
   a second substrate mounted on the first substrate;
   an IC chip mounted on a mounting surface of the second substrate;
   a plurality of electric connectors disposed on the mounting surface of the second substrate and around the IC chip, the plurality of electric connectors being configured to transmit optical signals or electrical signals;
   each of a plurality of communication modules connected to each of the plurality of electric connectors, the plurality of communication modules being configured to transmit the optical signals or the electrical signals; and
   a module cooling member including a plurality of slits provided along an array direction of the plurality of electric connectors, wherein
      the electric connector is disposed inside the slit of the module cooling member,
      the communication module can be connected to and disconnected from the electric connector disposed inside the slit through the slit, and the communication module connected to the electric connector is in contact with inside surfaces of the slit and thermally connected to the module cooling member.

2. The mounting structure according to claim 1, further comprising:
   a chip cooling member that is in contact with the IC chip and thermally connected to the IC chip, wherein
      the module cooling member and the chip cooling member are not in contact with each other and are thermally separated from each other.

3. The mounting structure according to claim 2,
   wherein the module cooling member and the chip cooling member are disposed on a same plane.

4. The mounting structure according to claim 2,
   wherein the module cooling member and the chip cooling member are disposed on different planes.

5. The mounting structure according to claim 2, further comprising:
   a first connector row including a plurality of electric connectors arrayed along a first side of the IC chip;
   a second connector row including a plurality of electric connectors arrayed along a second side of the IC chip;
   a first module cooling member thermally connected to the communication module that is connected to the electric connector included in the first connector row; and
   a second module cooling member thermally connected to the communication module that is connected to the electric connector included in the second connector row,
   wherein the chip cooling member includes a heat absorption unit overlapped with the IC chip and a heat radiation unit connected to the heat absorption unit.

6. The mounting structure according to claim 5, wherein
   the first module cooling member and the second module cooling member are disposed so as to be opposed to each other across the IC chip,
   the heat absorption unit of the chip cooling member is extended along the first connector row and the second connector row between the first module cooling member and the second module cooling member, and
   the two heat radiation units are connected to both ends of the heat absorption unit in a longitudinal direction.

7. The mounting structure according to claim 5, further comprising:
   a third connector row including a plurality of electric connectors arrayed along a third side of the IC chip;
   a fourth connector row including a plurality of electric connectors arrayed along a fourth side of the IC chip;
   a third module cooling member thermally connected to the communication module that is connected to the electric connector included in the third connector row; and
   a fourth module cooling member thermally connected to the communication module that is connected to the electric connector included in the fourth connector row,
   wherein the first module cooling member, the second module cooling member, the third module cooling member and the fourth module cooling member are disposed so as to surround the IC chip,
   the heat absorption unit of the chip cooling member is disposed inside the first module cooling member, the second module cooling member, the third module cooling member and the fourth module cooling member, and
   the heat radiation unit of the chip cooling member is disposed above the first module cooling member, the second module cooling member, the third module cooling member and the fourth module cooling member, and covers at least a part of the first, second, third and fourth module cooling members.

8. The mounting structure according to claim 2,
   wherein a plurality of heat radiation fins in parallel with each other are provided in each of the module cooling member and the chip cooling member.

9. The mounting structure according to claim 8,
   wherein an optical fiber extending from the communication module is passed through between the heat radiation fins provided in the module cooling member.

10. The mounting structure according to claim 2, further comprising:
    an air-cooling fan, wherein
       the module cooling member is disposed at an upstream side of cooling air generated by the air-cooling fan, and the chip cooling member is disposed at a downstream side of the cooling air.

11. The mounting structure according to claim 1, further comprising:
    a chip cooling member that is in contact with the IC chip and is thermally connected to the IC chip, wherein
       the module cooling member and the chip cooling member are integrated and are thermally connected to each other.

12. The mounting structure according to claim 11, wherein
    the chip cooling member includes a heat-exchanger having an inlet into which a liquid coolant is flowed in and an outlet from which a liquid coolant is flowed out,
    the heat-exchanger is overlapped with the IC chip, and
    a plurality of slits are provided along at least one side of the heat-exchanger.

13. The mounting structure according to claim 12, wherein
    a flow path that connects the inlet and the outlet is formed in the heat-exchanger,
    an upstream side of the flow path is closer to the communication module than a downstream side of the flow path, and a downstream side of the flow path is closer to the IC chip than an upstream side of the flow path.

* * * * *